United States Patent

Kodama

[11] Patent Number: 6,138,263
[45] Date of Patent: Oct. 24, 2000

[54] ERROR CORRECTING METHOD AND APPARATUS FOR INFORMATION DATA HAVING ERROR CORRECTING PRODUCT CODE BLOCK

[75] Inventor: Kunihiko Kodama, Yokohama, Japan

[73] Assignee: Kabushiki Kaisha Toshiba, Kawasaki, Japan

[21] Appl. No.: 09/055,911

[22] Filed: Apr. 7, 1998

[30] Foreign Application Priority Data

Apr. 8, 1997 [JP] Japan ................................... 9-103983

[51] Int. Cl.⁷ .......................... H03M 13/00; G11B 20/18
[52] U.S. Cl. .......................................................... 714/769
[58] Field of Search ................................... 714/755, 756, 714/758, 787, 788, 761, 762, 784, 769, 763; 386/33, 109

[56] References Cited

U.S. PATENT DOCUMENTS

| | | | |
|---|---|---|---|
| 5,506,823 | 4/1996 | Sanada | 369/48 |
| 5,574,570 | 11/1996 | Ohkuma et al. | 386/103 |
| 5,587,803 | 12/1996 | Inoue et al. | 386/33 |
| 5,608,740 | 3/1997 | Watanabe | 714/755 |
| 5,712,861 | 1/1998 | Inoue et al. | 714/752 |
| 5,757,824 | 5/1998 | Arai et al. | 714/755 |
| 5,771,248 | 6/1998 | Katayama et al. | 714/763 |
| 5,907,660 | 5/1999 | Inoue et al. | 386/109 |

*Primary Examiner*—Albert De Cady
*Assistant Examiner*—Shelly A Chase
*Attorney, Agent, or Firm*—Oblon, Spivak, McClelland, Maier & Neustadt, P.C.

[57] ABSTRACT

When the number of pieces of error position information detected by using one symbol, of internal and external symbols constituting an error correcting code added to information data, which has a data sequence substantially corresponding to the reception order of the information data exceeds the erasure correcting ability based on the other symbol, error position information is selected upon weighting based on the continuity of the error position information in consideration of the fact that burst error position information exhibits high continuity. By selecting error position information upon weighting based on continuity, erasure correction, which cannot be performed in the prior art, can be performed.

7 Claims, 13 Drawing Sheets

| d0 | d1 | d2 | d3 | d4 | d5 | d6 | d7 | d8 | d9 | d10 | d11 | d12 | d13 | d14 | d15 |
|---|---|---|---|---|---|---|---|---|---|---|---|---|---|---|---|
| d16 | d17 | d18 | d19 | d20 | d21 | d22 | d23 | d24 | d25 | d26 | d27 | d28 | d29 | d30 | d31 |
| d32 | d33 | d34 | d35 | d36 | d37 | d38 | d39 | d40 | d41 | d42 | d43 | d44 | d45 | d46 | d47 |
| d48 | d49 | d50 | d51 | d52 | d53 | d54 | d55 | d56 | d57 | d58 | d59 | d60 | d61 | d62 | d63 |
| d64 | d65 | d66 | d67 | d68 | d69 | d70 | d71 | d72 | d73 | d74 | d75 | d76 | d77 | d78 | d79 |
| d80 | d81 | d82 | d83 | d84 | d85 | d86 | d87 | d88 | d89 | d90 | d91 | d92 | d93 | d94 | d95 |
| d96 | d97 | d98 | d99 | d100 | d101 | d102 | d103 | d104 | d105 | d106 | d107 | d108 | d109 | d110 | d111 |
| d112 | d113 | d114 | d115 | d116 | d117 | d118 | d119 | d120 | d121 | d122 | d123 | d124 | d125 | d126 | d127 |
| d128 | d129 | d130 | d131 | d132 | d133 | d134 | d135 | d136 | d137 | d138 | d139 | d140 | D141 | d142 | d143 |
| d144 | d145 | d146 | d147 | d148 | d149 | d150 | d151 | d152 | d153 | d154 | d155 | d156 | d157 | d158 | d159 |
| d160 | d161 | d162 | d163 | d164 | d165 | d166 | d167 | d168 | d169 | d170 | d171 | d172 | d173 | d174 | d175 |
| d176 | d177 | d178 | d179 | d180 | d181 | d182 | d183 | d184 | d185 | d186 | d187 | d188 | d189 | d190 | d191 |
| d192 | d193 | d194 | d195 | d196 | d197 | d198 | d199 | d200 | d201 | d202 | d203 | d204 | d205 | d206 | d207 |
| d208 | d209 | d210 | d211 | d212 | d213 | d214 | d215 | d216 | d217 | d218 | d219 | d220 | d221 | d222 | d223 |
| d224 | d225 | d226 | d227 | d228 | d229 | d230 | d231 | d232 | d233 | d234 | d235 | d236 | d237 | d238 | d239 |
| d240 | d241 | d242 | d243 | d244 | d245 | d246 | d247 | d248 | d249 | d250 | d251 | d252 | d253 | d254 | d255 |

DATA SEQUENCE OF C1 CODE = RSC (16, 12, 5)

DATA SEQUENCE OF C2 CODE = RSC (16, 12, 5)

DATA SEQUENCE OF C1 CODE = RSC (16,12,5)

| d0 | d1 | d2 | d3 | d4 | d5 | d6 | d7 | d8 | d9 | d10 | d11 | d12 | d13 | d14 | d15 |
|---|---|---|---|---|---|---|---|---|---|---|---|---|---|---|---|
| d16 | d17 | d18 | d19 | d20 | d21 | d22 | d23 | d24 | d25 | d26 | d27 | d28 | d29 | d30 | d31 |
| d32 | d33 | d34 | d35 | d36 | d37 | d38 | d39 | d40 | d41 | d42 | d43 | d44 | d45 | d46 | d47 |
| d48 | d49 | d50 | d51 | d52 | d53 | d54 | d55 | d56 | d57 | d58 | d59 | d60 | d61 | d62 | d63 |
| d64 | d65 | d66 | d67 | d68 | d69 | d70 | d71 | d72 | d73 | d74 | d75 | d76 | d77 | d78 | d79 |
| d80 | d81 | d82 | d83 | d84 | d85 | d86 | d87 | d88 | d89 | d90 | d91 | d92 | d93 | d94 | d95 |
| d96 | d97 | d98 | d99 | d100 | d101 | d102 | d103 | d104 | d105 | d106 | d107 | d108 | d109 | d110 | d111 |
| d112 | d113 | d114 | d115 | d116 | d117 | d118 | d119 | d120 | d121 | d122 | d123 | d124 | d125 | d126 | d127 |
| d128 | d129 | d130 | d131 | d132 | d133 | d134 | d135 | d136 | d137 | d138 | d139 | d140 | D141 | d142 | d143 |
| d144 | d145 | d146 | d147 | d148 | d149 | d150 | d151 | d152 | d153 | d154 | d155 | d156 | d157 | d158 | d159 |
| d160 | d161 | d162 | d163 | d164 | d165 | d166 | d167 | d168 | d169 | d170 | d171 | d172 | d173 | d174 | d175 |
| d176 | d177 | d178 | d179 | d180 | d181 | d182 | d183 | d184 | d185 | d186 | d187 | d188 | d189 | d190 | d191 |
| d192 | d193 | d194 | d195 | d196 | d197 | d198 | d199 | d200 | d201 | d202 | d203 | d204 | d205 | d206 | d207 |
| d208 | d209 | d210 | d211 | d212 | d213 | d214 | d215 | d216 | d217 | d218 | d219 | d220 | d221 | d222 | d223 |
| d224 | d225 | d226 | d227 | d228 | d229 | d230 | d231 | d232 | d233 | d234 | d235 | d236 | d237 | d238 | d239 |
| d240 | d241 | d242 | d243 | d244 | d245 | d246 | d247 | d248 | d249 | d250 | d251 | d252 | d253 | d254 | d255 |

DATA SEQUENCE OF C2 CODE = RSC(16,12,5)    PO

PI

ERROR CORRECTING METHOD AND APPARATUS FOR INFORMATION DATA HAVING ERROR CORRECTING PRODUCT CODE BLOCK

BACKGROUND OF THE INVENTION

The present invention relates to an error correcting method and apparatus for correcting error data included in information data having a Reed-Solomon error correcting product code block.

The data transmission system in a conventional disk reproducing apparatus or the like is generally constituted by a reception unit for receiving read data from a disk or the like, a temporary memory for temporarily storing the received information data, an error correcting unit for correcting errors in the information data stored in the temporary memory, and a transmission unit for transmitting the error-corrected information data.

The information data recorded on a disk or the like is received by the reception unit. The received information data is temporarily stored in the temporary memory. Thereafter, error correction is performed for the information data stored in the temporary memory.

In a system for recording and transmitting digital data in units of bytes each consisting of eight bits, data are processed by configuring Reed-Solomon error correcting product code blocks. More specifically, after arranging data of (M*N) bytes in M rows * N columns, error correcting check words P1 are added to the M-byte information section of each row, and error correcting check words P0 are added to the N-byte information section of each column to produce a Reed-Solomon error correcting product code block comprising (M+P1) rows * (N+P0) columns. Then, random errors and burst errors can be efficiently corrected on the data reproducing side or the data receiving side by recording/transmitting the Reed-Solomon error correcting product code block. The above error correcting unit performs error correction by using the above Reed-Solomon error correcting product code block.

The information data having undergone error correction in the error correcting unit is stored in the temporary memory again. The information data is then read out and sent to the transmission unit to be transmitted to the next stage.

In the initial error correction processing performed by the error correcting apparatus, since there is no error information for erasure correction, error correction is performed by using only one type of error correcting check words constituting a Reed-Solomon error correcting product code block. In the subsequent error correction processing using the other type of error correcting check words, erasure correction is performed by using the error position information detected in the preceding error correction processing, in addition to error correction using only the error correcting check words.

As described above, the conventional error correcting circuit used for a data transmission system uses error detection information obtained by using one type of error correcting check words, i.e., either error correcting check words P0 or error correcting check words P1, which constitute the Reed-Solomon error correcting product code block, and performs erasure correction using the other type of error correcting check words.

If, however, the number of errors detected by using one type of error correcting check words exceeds the erasure correcting ability based on the other type of error correcting check words, the corresponding data is treated as data for which erasure correction cannot be performed.

Consider, for example, information data constituted by a Reed-Solomon error correcting product code block consisting of a plurality of Reed-Solomon code words C1 (16, 12, 5) to which 4-word error correcting check words P1 are respectively added and a plurality of Reed-Solomon code words C2 (16, 12, 5) to which 4-word error correcting check words P0 are respectively added, as shown in FIG. 1. If the number of uncorrectable codes determined as a result of error correction using code words C1 is four or less, erasure correction using code words C2 can be performed. If, however, the number of uncorrectable codes is five or more, it exceeds the erasure correcting ability based on code words C2, and error correction is inhibited.

A conventional error correcting method used when random errors (d37, d38, d39) and (d213, d214, d215) and burst errors (d102 to d154) have occurred in information data, as shown in FIG. 2, will be described with reference to FIGS. 3 to 5. Of hatched areas A, B, and C in FIG. 3, the areas A and C correspond to the areas where the random errors (d37, d38, d39) and (d213, d214, d215) have occurred, and the area B corresponds to the area where the burst errors (d102 to d154) have occurred.

(a) First of all, as shown in FIG. 3, since the initial error correction processing using code words C1 exceeds the correcting ability, position information about the positions where errors have occurred is generated. Of this position information, "x" indicates a position where an error has occurred, and "O" indicates a position where no error has occurred.

(b) As shown in FIG. 4, error correction is performed by using code words C2. However, since the number of error positions in the error position information based on code words C1 (six in this case) exceeds the erasure correcting ability (four or less) based on code words C2, erasure correction cannot be performed. In this case, error position information is also generated. Of this position information as well, "x" indicates a position where an error has occurred, and "O" indicates a position where no error has occurred.

(b) Subsequently, as shown in FIG. 5, error correction using code words C1 is performed. However, since the number of error positions in the error position information based on code words C2 (16 in this case) exceeds the erasure correcting ability based on code words C1, erasure correction cannot be performed.

As described above, errors like those included in the data shown in FIG. 2 cannot be corrected by the conventional error correcting method regardless of how many times error correcting operations using code words C1 and C2 are alternately repeated.

BRIEF SUMMARY OF THE INVENTION

It is, therefore, an object of the present invention to provide an error correcting method and apparatus which can perform data erasure correction which cannot be performed in the prior art.

According to the present invention, there is provided a data transmission system comprising a unit for receiving information data to which an error correcting code constituted by internal and external symbols is added, a unit for temporarily storing the received information data, a unit for generating error position information by using the error correcting code, a unit for correcting an error in the temporarily stored information data by using the error correcting code on the basis of the error position information, and a unit for transmitting the error-corrected information data, wherein a sequence of data of one of the internal and external symbols substantially corresponds to a reception order of the information data, the error position information is weighted in accordance with continuity of the error position information, and erasure correction using the other symbol is performed by selecting error position information of the number of correctable errors when the number of pieces of error position information exceeds an erasure correcting ability of the other symbol of the internal and external symbols.

According to the present invention, there is provided an error correcting apparatus comprising means for temporarily storing information data received by a unit for receiving information data to which an error correcting code constituted by internal and external symbols is added, means for generating error position information by using the error correcting code, and means for correcting an error in the temporarily stored information data by using the error correcting code on the basis of the error position information, wherein a sequence of data of one of the internal and external symbols substantially corresponds to a reception order of the information data, the error position information is weighted in accordance with continuity of the error position information, and erasure correction using the other symbol is performed by selecting error position information of the number of correctable errors when the number of pieces of error position information exceeds an erasure correcting ability of the other symbol of the internal and external symbols.

According to the present invention, there is provided an error correcting method comprising the steps of a. before storing, in a temporary memory, information data to which an error correcting check code constituted by internal and external symbols is added, detecting an error of one of the internal and external symbols which exhibits the same reception order as that of the information data, and transferring the detected error information to an error correcting apparatus, b. reading out the other symbol of the internal and external symbols added to the information data from the temporary memory and sending the code to the error correcting apparatus, c. performing error correction using only the other symbol and also performing erasure correction on the basis of the detected error information, d. correcting the information data in the temporary memory, e. reading out one symbol of the information data from the temporary memory, f. performing error correction using only one symbol and also performing erasure correction using the error information of the other symbol, g. correcting the information data in the temporary memory, h. reading out the other symbol from the temporary memory, i. performing error correction using only the other symbol and also performing erasure correction using the error information of one symbol, and j. correcting the information data in the temporary memory, wherein error correction is performed in the order of the steps a to j, error correction after the step e is repeated as needed, a sequence of data of one symbol substantially corresponds to the reception order of the information data, the error information is weighted in accordance with continuity of the error information, and erasure correction using the other symbol is performed by selecting correctable error information when the number of pieces of error information exceeds an erasure correcting ability based on the other symbol.

According to the present invention, there is provided an error correcting method comprising the steps of a. storing information data in a temporary memory, b. reading out one of internal and external symbols added to the information data from the temporary memory and sending the code to an error correcting apparatus, c. performing error correction using only one symbol and also performing erasure correction on the basis of the detected error information, d. correcting the information data in the temporary memory, e. reading out the other symbol of the internal and external symbols of the information data from the temporary memory, f. performing error correction using only the other symbol and also performing erasure correction using the error information of one symbol, g. correcting the information data in the temporary memory, h. reading out one symbol from the temporary memory, i. performing error correction using only one symbol and also performing erasure correction using the error information of the other symbol, and j. correcting the information data in the temporary memory, wherein error correction is performed in the order of the steps a to j, error correction after the step e is repeated as needed, a sequence of data of one symbol substantially corresponds to the reception order of the information data, the error information is weighted in accordance with continuity of the error information, and erasure correction using the other symbol is performed by selecting correctable error information when the number of pieces of error information exceeds an erasure correcting ability based on the other symbol.

According to the present invention, there is provided a DVD reproducing apparatus comprising a reception unit for receiving modulated information data to which an error correcting code constituted by internal and external symbols is added, a demodulation unit for demodulating the information data, a temporary memory for temporarily storing the demodulated information data, detecting an error in one of the internal and external symbols of the demodulated information data, an error correcting unit for correcting the error in the temporarily stored information data, a descramble unit to which the error-corrected information data is input, and a transmission unit for transmitting the information data input from the descramble unit, wherein a sequence of data of the internal symbol corresponds to a reception order of the information data, error information of one symbol is used for erasure correction for the other symbol of the internal and external symbols, the error information is weighted in accordance with continuity of the error information, and erasure correction using the other symbol is performed by selecting correctable error information when the number of pieces of error information exceeds an erasure correcting ability based on the other symbol.

According to the present invention, there is provided a DVD reproducing apparatus comprising a reception unit for receiving modulated information data to which an error correcting code constituted by internal and external symbols is added, a demodulation unit for demodulating the information data, a temporary memory for temporarily storing the demodulated information data, an error correcting unit for correcting the error in the temporarily stored information data, a descramble unit to which the error-corrected information data is input, and a transmission unit for transmitting the information data input from the descramble unit, wherein a sequence of data of the internal symbol corresponds to a reception order of the information data, error information of one symbol is used for erasure correction for the other symbol of the internal and external symbols, the error information is weighted in accordance with continuity of the error information, and erasure correction using the other symbol is performed by selecting correctable error information when the number of pieces of error information exceeds an erasure correcting ability based on the other symbol.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing information data to which error correcting check words are added;

FIG. 2 is a view showing information data including errors;

DETAILED DESCRIPTION OF THE INVENTION

Embodiments of the present invention will be described below with reference to the several views of the accompanying drawing.

A process for correcting errors in the information data in FIG. 1 by using an error correcting apparatus according to the present invention will be described first with reference to FIGS. 6 to 8. Of hatched areas A, B, and C in FIG. 6, the areas A and C correspond to the areas where the above random errors have occurred, and the area B corresponds to the area where the above burst errors have occurred.

Figure 3:
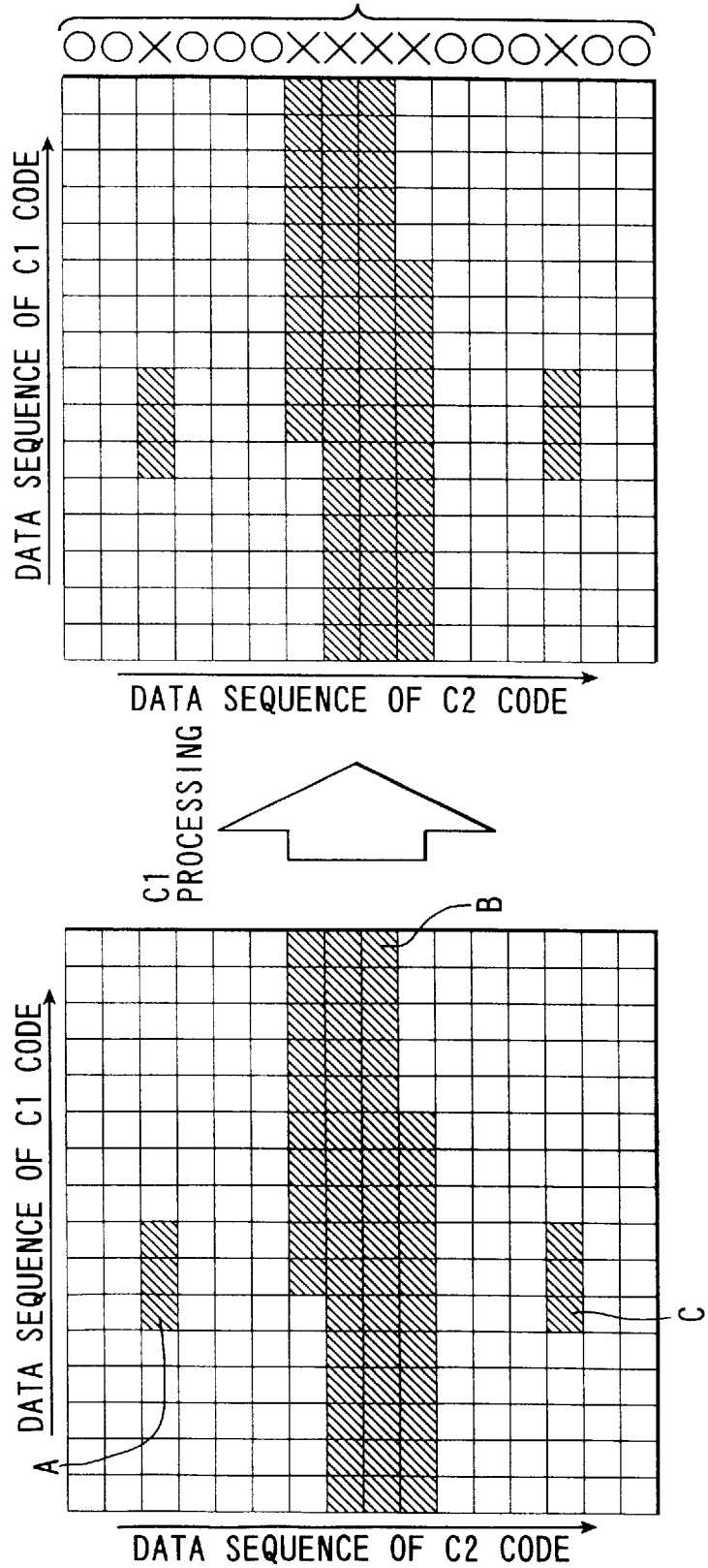
FIG. 3 is a view showing a process of performing error correction for information data including errors by a conventional method.
Figure 4:
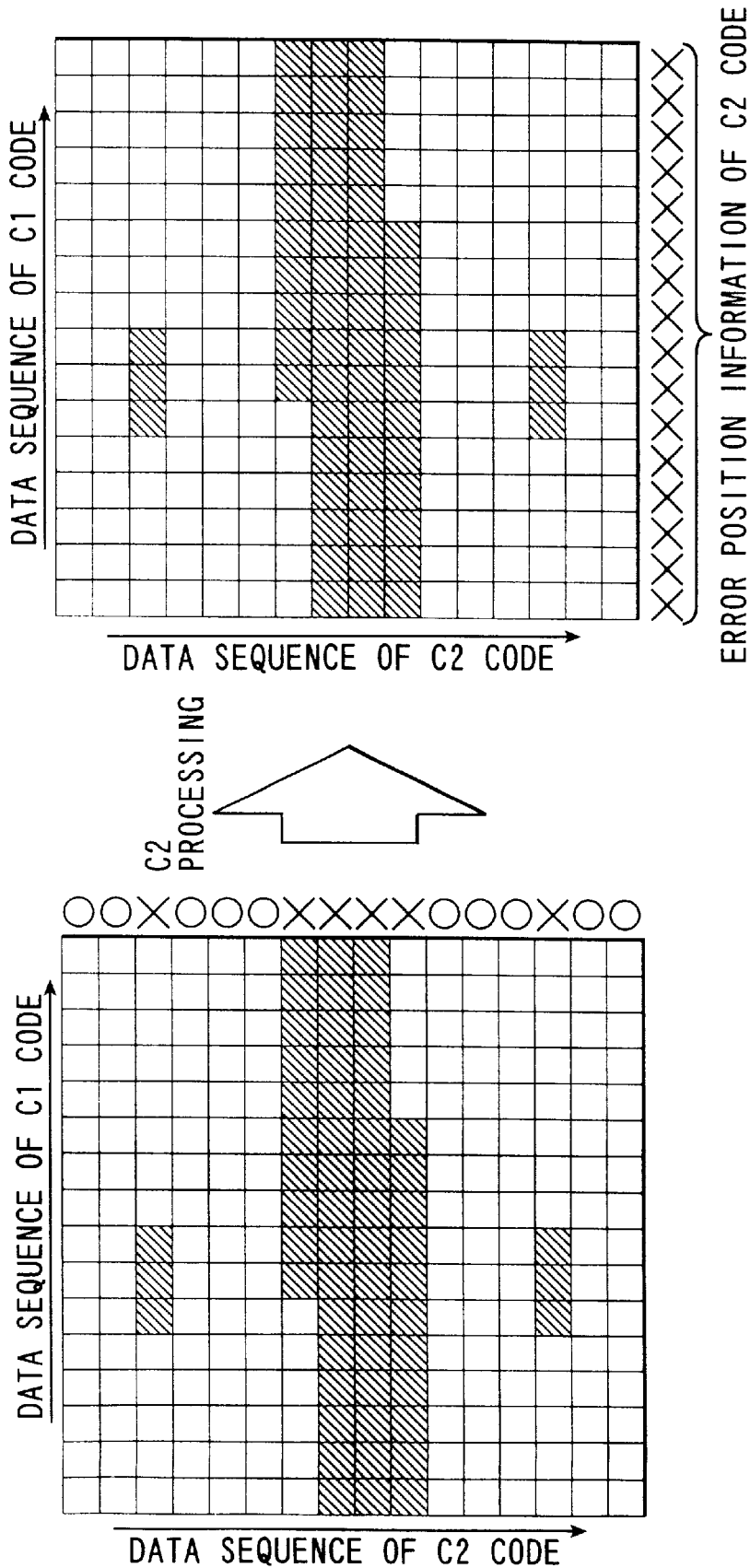
FIG. 4 is a view showing a process of performing error correction for the information data including the errors by the conventional method.
Figure 5:
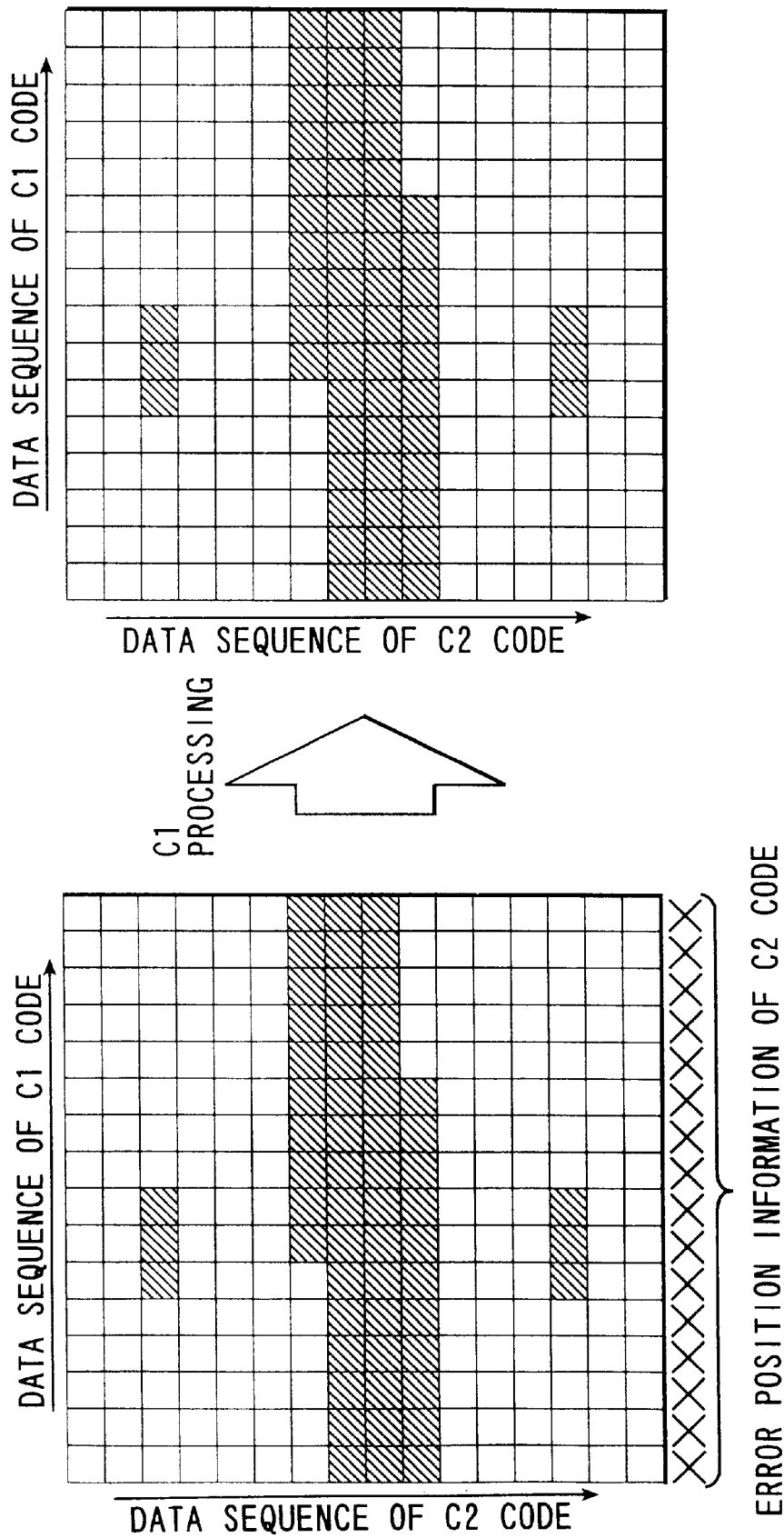
FIG. 5 is a view showing a process of performing error correction for the information data including the errors by the conventional method.
Figure 6:
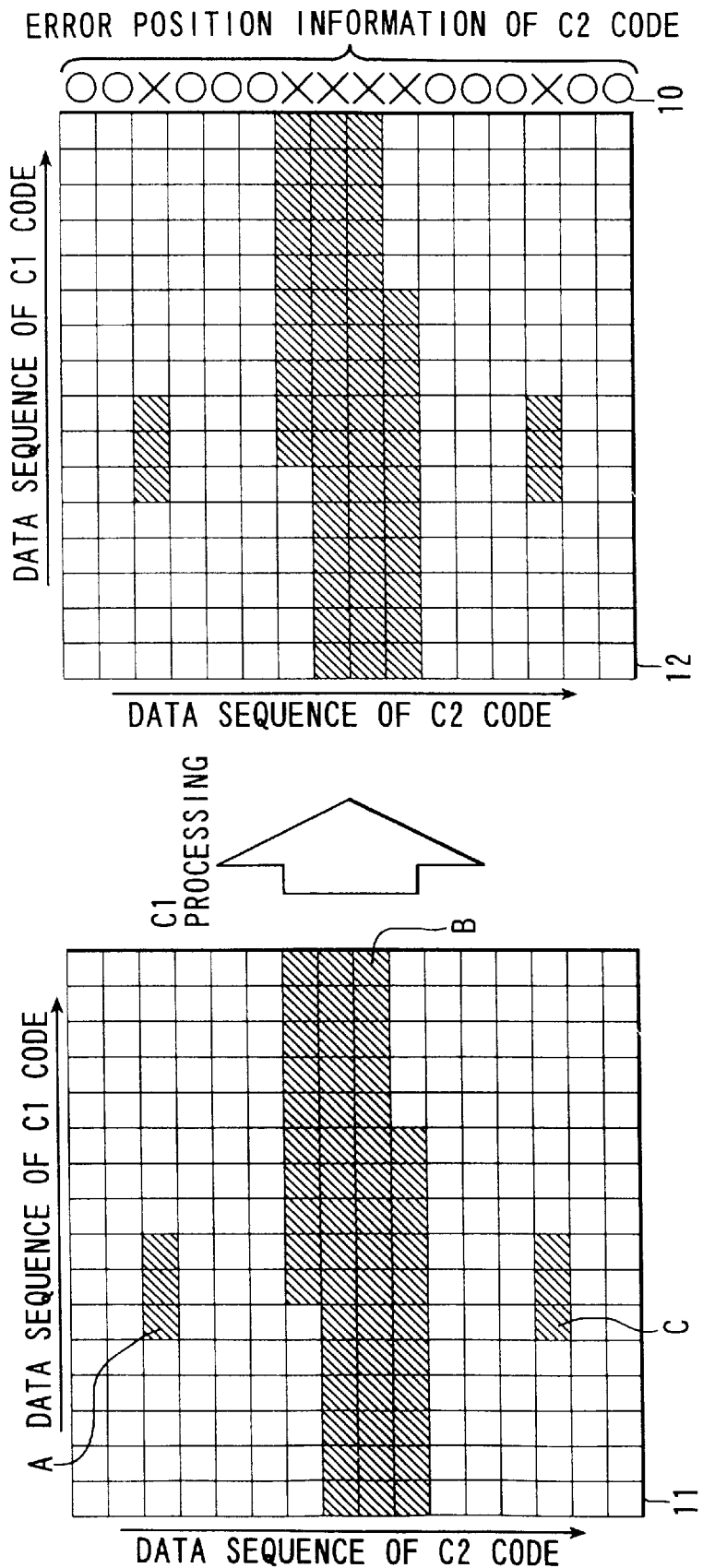
FIG. 6 is a view showing a process of performing error correction for information data including errors by a method of the present invention.

(a) First of all, as shown in FIG. 6, since the initial error correction processing using code words C1 exceeds the error correcting ability, position information indicating the positions where errors have occurred is generated. Error position information 10 of the code words C1 is expressed by "x" and "○". Each position where an error has occurred is represented by "x". Each position where no error has occurred is represented by "○". The information data shown in FIG. 1 is received by the reception unit. The received information data, i.e., received data 11, is changed into data 12 upon error correction using code words C1.

Figure 7:
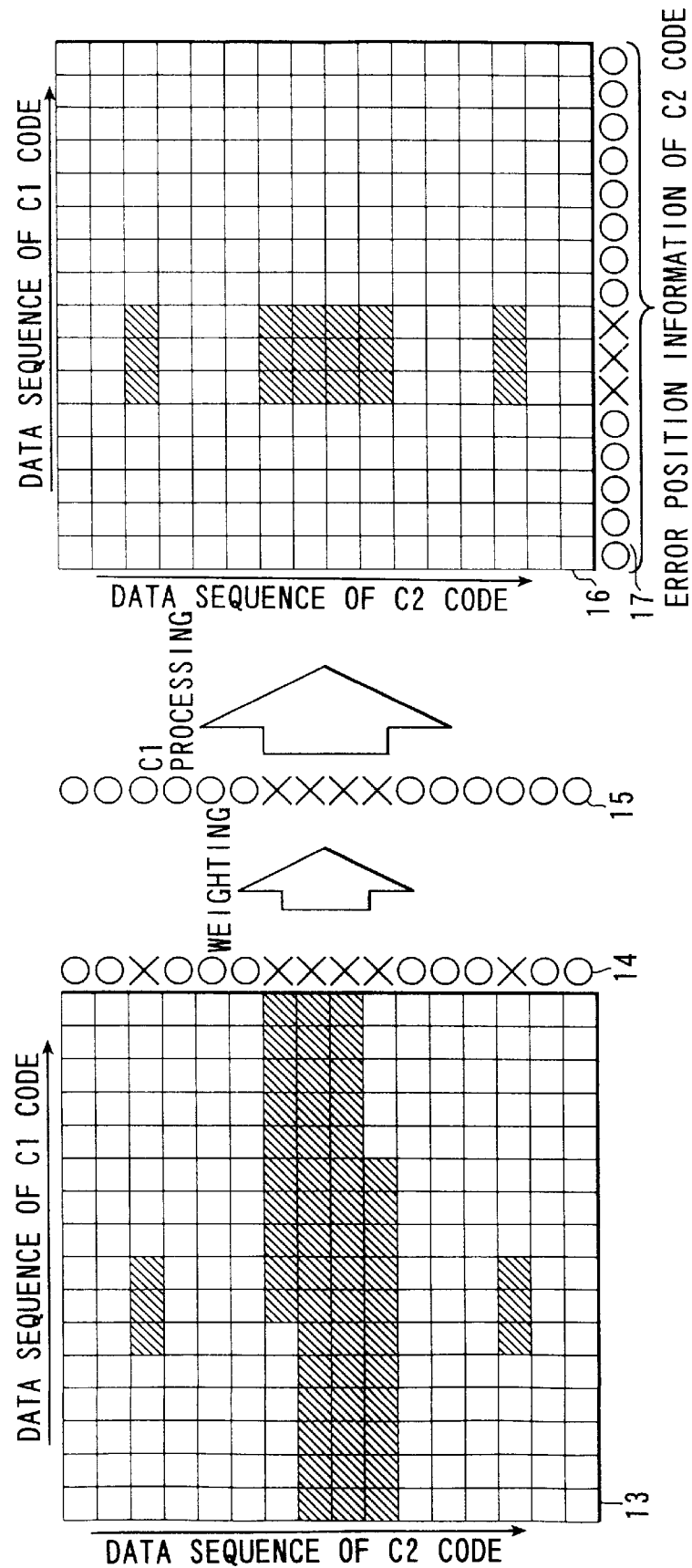
FIG. 7 is a view showing a process of performing error correction for the information data including the errors by the method of the present invention.

(b) As shown in FIG. 7, error correction using code words C2 is performed next. In this case, the number of error positions in the error position information of code words C1 exceeds the error correcting ability based on code words C2. For this reason, weighting is performed on the basis of the continuity of the information data, and erasure correction is performed by using only the burst error position information. In information data 13 obtained after error correction using code words C1, the number of error positions in error position information 14 is six. By performing the above weighting, the number of error positions is reduced to four in error position information 15. Error correction is then performed by using code words C2 on the basis of the error position information 15. In information data 16 obtained after error correction using code words C2, new error position information 17 is obtained by error correction using code words C2.

Figure 8:
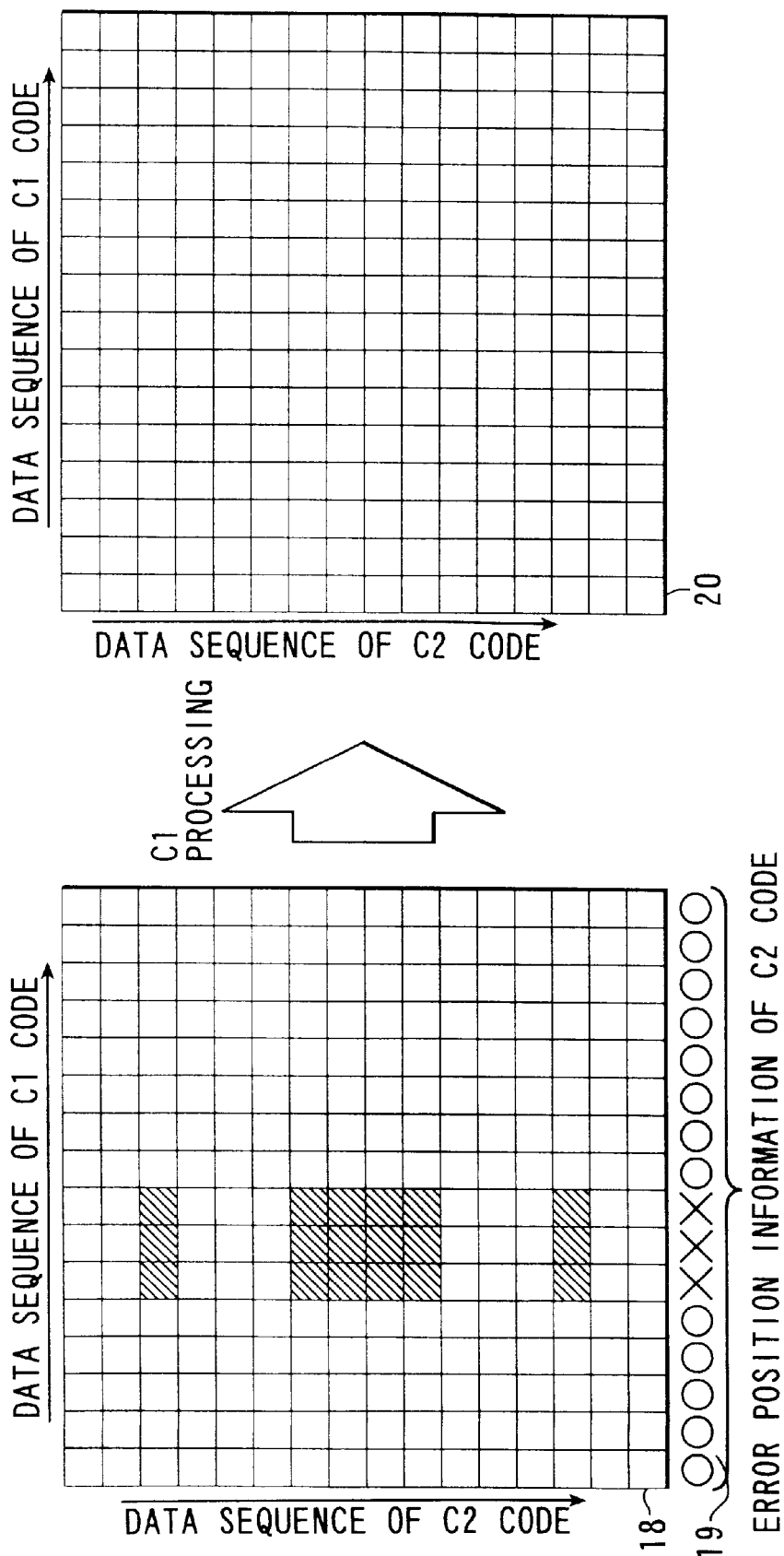
FIG. 8 is a view showing a process of performing error correction for the information data including the errors by the method of the present invention.

(c) As shown in FIG. 8, error correction using code words C1 is performed again. The number of error positions included in error position information 19 detected from information data 18 obtained after error correction using code words C2 is three, which does not exceed an erasure correction ability corresponding to five. All the errors can therefore be corrected as indicated by information data 20 by performing error correction using code words C1 for the second time.

In the above method, only the continuous error position information is selected. However, the error position information may be compressed by performing weighting in accordance with the distances between the error positions.

An error correcting apparatus for correcting errors in information data by the above method according to the present invention will be described next.

Figure 9:
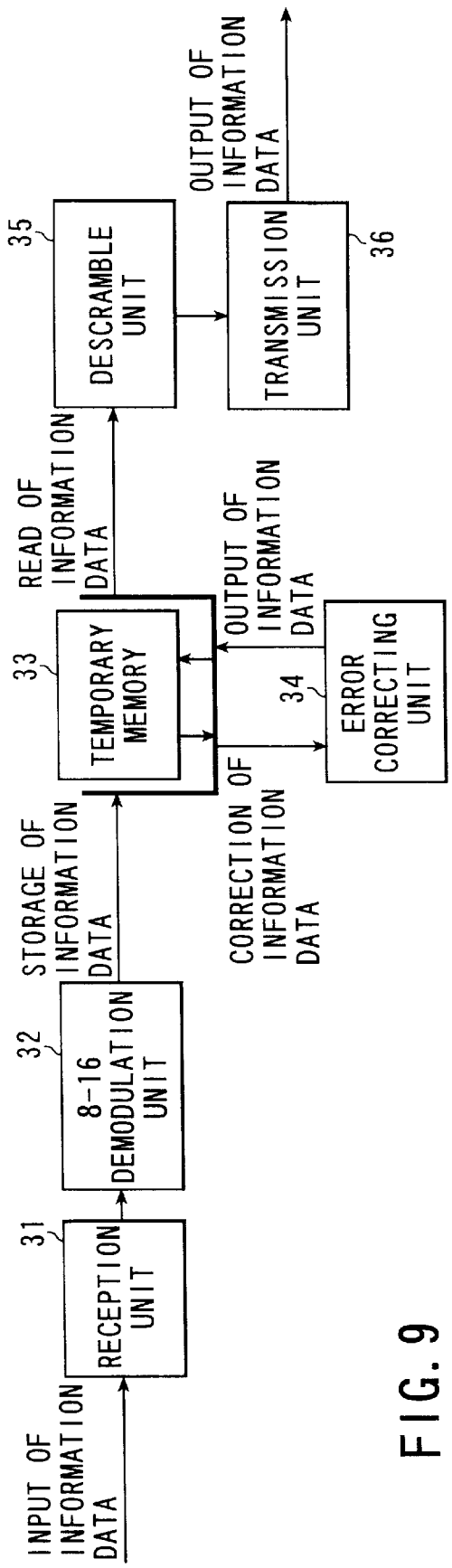
FIG. 9 is a block diagram showing a DVD reproducing apparatus according to the first embodiment of the present invention.

FIG. 9 shows the arrangement of a digital versatile disk (DVD) reproducing apparatus according to the first embodiment of the present invention. This DVD reproducing apparatus is constituted by a reception unit 31 for receiving read data from a disk, an 8–16 demodulation unit 32 for demodulating the received information data in accordance with the 8–16 modulation scheme, a temporary memory 33 for temporarily storing the demodulated information data, an error correcting unit 34 for correcting errors in the information data stored in the temporary memory 33, a descramble unit 35 for reading out the error-corrected information data, and a transmission unit 36 for transmitting the information data read out by the descramble unit 35.

In this DVD reproducing apparatus, since one unit of the information data received by the reception unit 31 is modulated into 16 bits, the information data is demodulated into 8-bit information data by the 8–16 demodulation unit 32. The demodulated information data is stored in the temporary memory 33. Thereafter, the information data stored in the temporary memory 33 is sent to the error correcting unit 34. The error correcting unit 34 performs error correction by using error correcting check words P1 (internal symbol) and error correcting check words P0 (external symbol) included in the information data. The error-corrected information data is sent to the temporary memory 33 again to be stored. The error-corrected information data stored in the temporary memory 33 is read out by the descramble unit 35. The readout information data is then transmitted from the transmission unit 36.

Figure 10A:
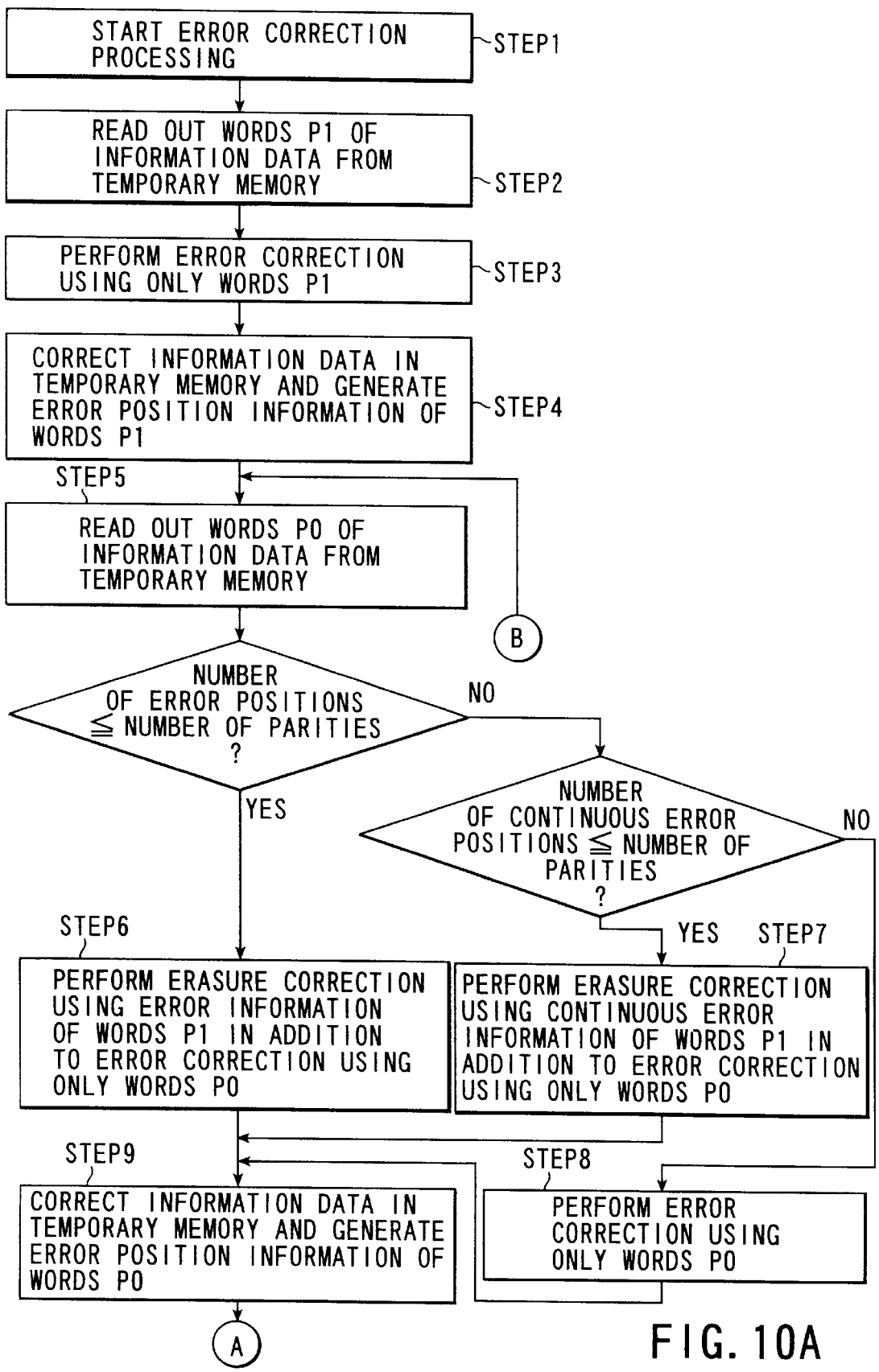
FIGS. 10A and 10B are flow charts showing the operation of the DVD reproducing apparatus in FIG. 9.
Figure 10B:
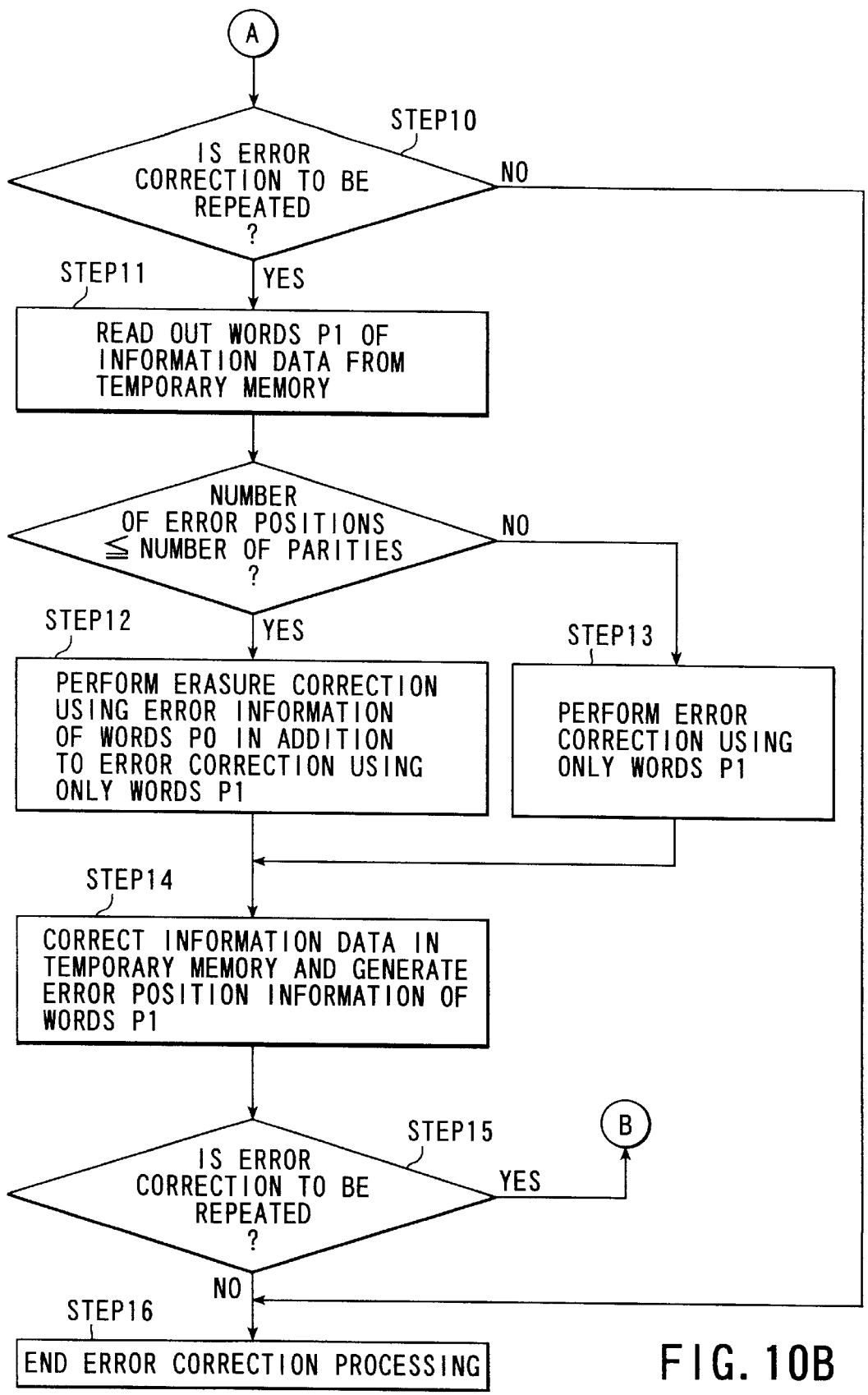

The error correcting operation of the above apparatus will be described next with reference to the flow chart of FIGS. 10A and 10B.

Step 1: Error correction is started.

Step 2: Error correcting check words P1 of the data are read out from the temporary memory 33 and sent to the error correcting unit 34.

Step 3: The error correcting unit 34 performs error correction by using only error correcting check words P1.

Step 4: The data in the temporary memory 33 is corrected, and error position information about all error correcting check words P1 is generated. In addition, the number of uncorrectable error positions in all error correcting check words P1 is detected on the basis of this error position information.

Step 5: Error correcting check words P0 of the information data are read out from the temporary memory 33 and sent to the error correcting unit 34.

Step 6: If the number of uncorrectable error positions detected in step 4 is equal to or smaller than the number of parity bits (the number of uncorrectable error correcting check words P1 detected in step 4 does not exceed the erasure correcting ability based on error correcting check words P0), the error position information generated in step 4 is used for erasure correction based on error correcting check words P0.

Step 7: If the number of uncorrectable error positions detected in step 4 exceeds the number of parity bits, only the continuous position information of the error position information generated in step 4 (if the number of continuous error positions is equal to or smaller than the number of parity bits) is used for erasure correction based on error correcting check words P0.

Step 8: If the number of uncorrectable error positions detected in step 4 exceeds the number of parity bits, and the number of continuous error positions exceeds the number of parity bits, error correction is performed by using only error correcting check words P0.

Step 9: Error correction using error correcting check words P0 and erasure correction based on the error position information generated in step 4 are executed, whereas error position information is generated with respect to uncorrectable error correcting check words P0.

Step 10: Error correction is repeated.

Step 11: Error correcting check words P1 of the information data are read out from the temporary memory 33 and sent to the error correcting unit 34.

Step 12: If the number of error positions in error correcting check words P1 is equal to or smaller than the number of parity bits, erasure correction using error correcting check words P0 is performed as well as error correction using error correcting check words P1.

Step 13: If the number of error positions in error correcting check words P1 exceeds the number of parity bits, error correction is performed by using only error correcting check words P1.

Step 14: Error correction using error correcting check words P1 and erasure correction using the error position information generated in step 9 are executed, whereas error position information is generated with respect to uncorrectable error correcting check words P1. In addition, the number of uncorrectable words of all error correcting check words P1 is detected.

Step 15: Error correction can be further repeated.

Step 16: The error correction processing is terminated.

As described above, in the DVD reproducing apparatus shown in FIG. 9, even if the number of uncorrectable error correcting check words P1 exceeds the erasure correcting ability based on error correcting check words P0, error correction can be performed for the information data as long as the number of error positions represented by continuous error position information does not exceed the erasure correcting ability based on error correcting check words P0.

Figure 11:
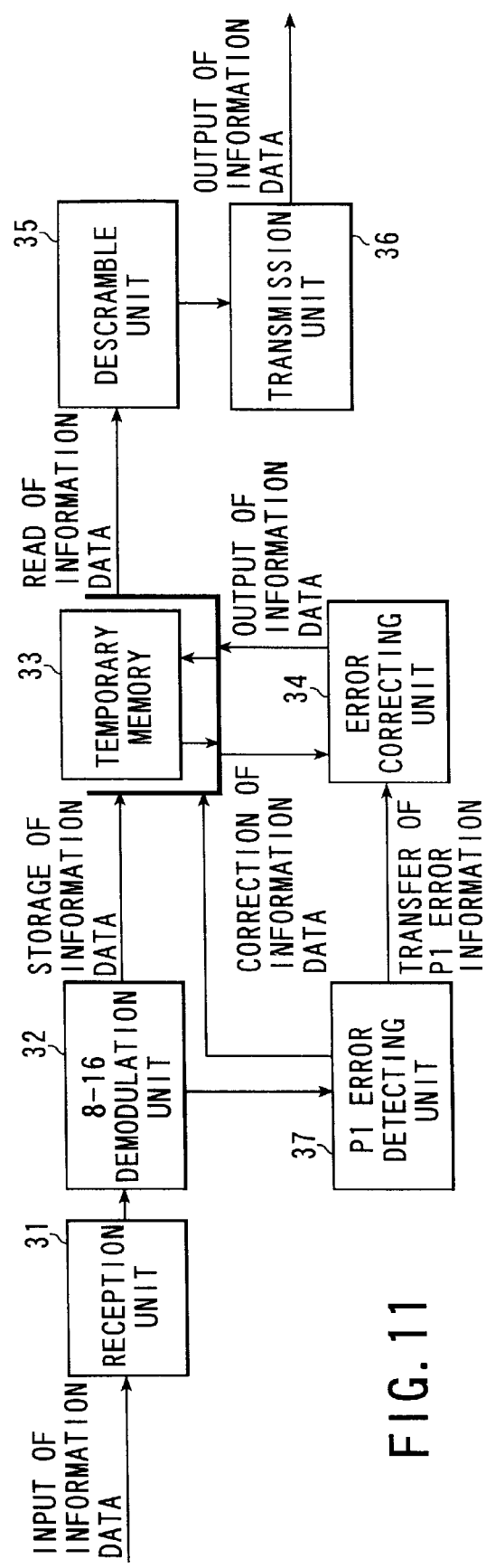
FIG. 11 is a block diagram showing a DVD reproducing apparatus according to the second embodiment of the present invention.

FIG. 11 shows the arrangement of a DVD reproducing apparatus according to the second embodiment of the present invention. This DVD reproducing apparatus differs from the DVD reproducing apparatus according to the first embodiment shown in FIG. 9 in that a P1 error detecting unit 37 is added.

The P1 error detecting unit 37 receives information data demodulated by an 8–16 demodulation unit 32, and detects errors from the information data. The information data having undergone error detection is sent to a temporary memory 33 to be temporarily stored therein as in the first embodiment. The error information detected by the P1 error detecting unit 37 is sent to an error correcting unit 34.

Since the other arrangements of the second embodiment are the same as those of the first embodiment, a description thereof will be omitted.

In the DVD reproducing apparatus with this arrangement, since error information for erasure correction is obtained in advance by the P1 error detecting unit 37, erasure correction can be performed from the initial error correction processing.

The error correcting operation of the above apparatus will be described next.

In this case, the presence/absence of an error in every syndrome of error correcting check word P1 is to be detected.

(1) The P1 error detecting unit 37 calculates the syndromes of error correcting check words P1 before information data received by a reception unit 31 is demodulated by the 8–16 demodulation unit 32 and stored in the temporary memory 33. The presence/absence of an error in the information data is detected by checking whether all 10 syndromes, i.e., S0 to S9, are zero. The detected error information is sent to the error correcting unit 34. In general, in the DVD reproducing apparatus, error correcting check word P1 corresponds to 10 parity bits; and error correcting check word P0, 16 parity bits. In addition, in the DVD reproducing apparatus, a sequence of error correcting check word P1 coincides with a sequence of received data, and hence syndromes can be directly calculated from the demodulated data.

(2) The error correcting unit 34 starts processing from error correction using error correcting check words P0. At this time, erasure correction is performed on the basis of the error information of error correcting check words P1 obtained in the preceding step, in addition to error correction using error correcting check words P0. That is, error correction is performed in the following sequence: P1 detection, P0 detection, P1 detection, P0 detection, P1 detection, . . .

Figure 12A:
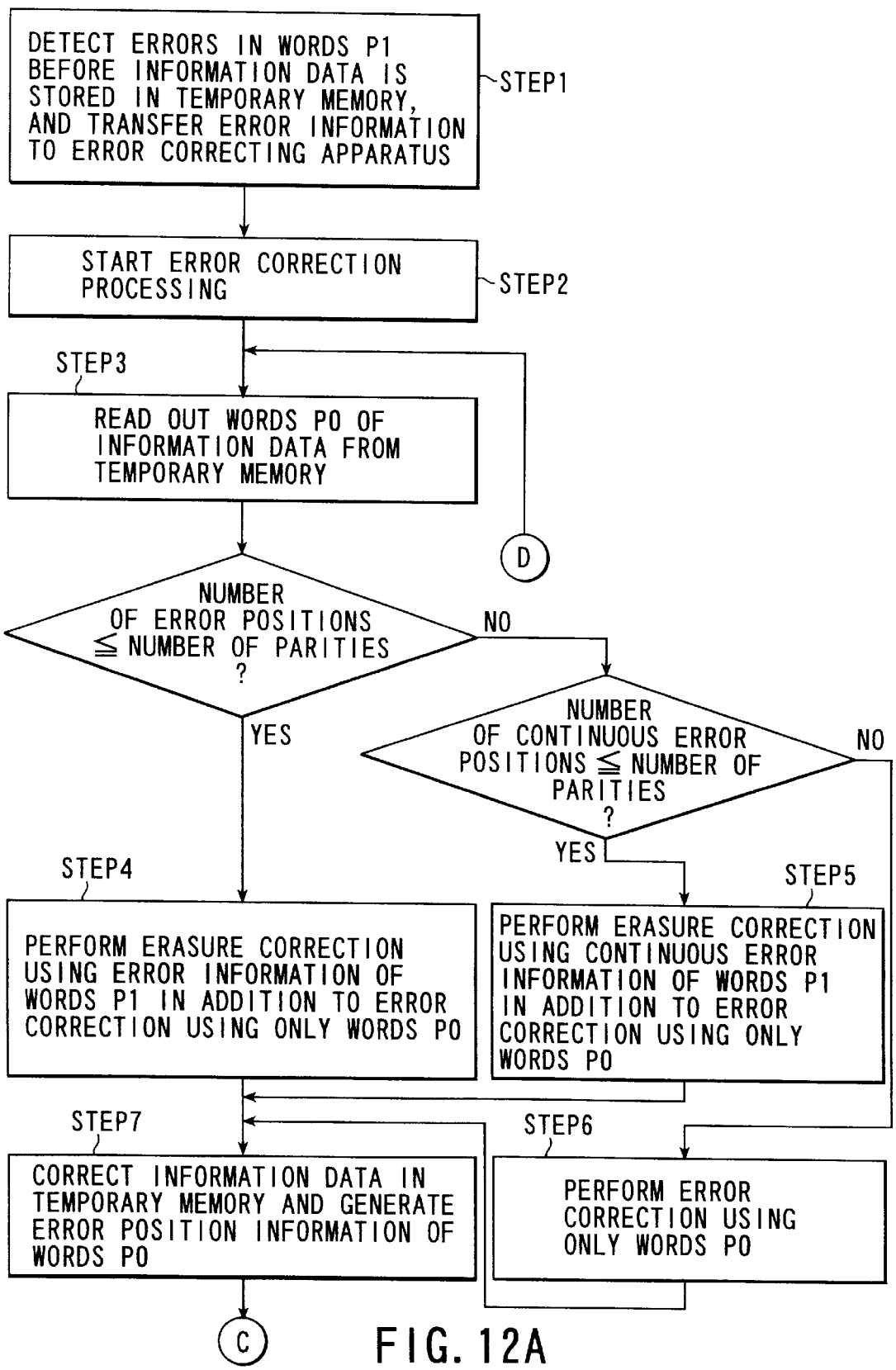
FIGS. 12A and 12B are flow charts showing the operation of the DVD reproducing apparatus in FIG. 11.
Figure 12B:
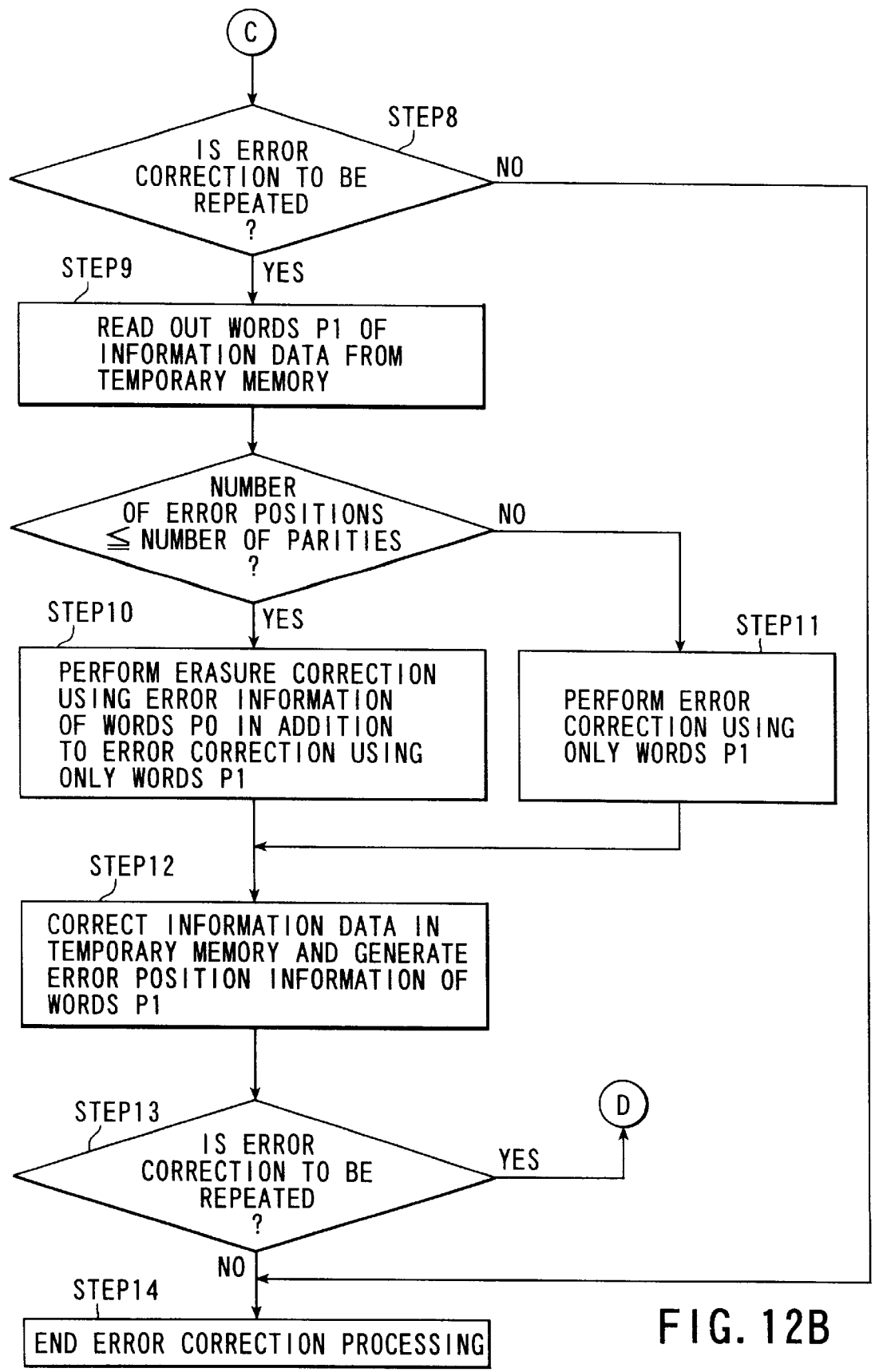

The operation of the apparatus shown in FIG. 11 will be described in detail next with reference to the flow chart of FIGS. 12A and 12B.

Step 1: Error detection using error correcting check words P1 is performed on the basis of the information data demodulated by the 8–16 demodulation unit 32 to generate error position information. In addition, the number of uncorrectable error positions of all error correcting check word P1 is detected on the basis of this error position information. This error position information is sent to the error correcting unit 34.

Step 2: Error correction is started.

Step 3: Error correcting check words P0 of the information data are read out from the temporary memory 33 and sent to the error correcting unit 34.

Step 4: If the number of uncorrectable error positions detected in step 1 is equal to or smaller than the number of parity bits (the number of uncorrectable error correcting check words P1 detected in step 1 does not exceed the erasure correcting ability of error correcting check words P0), erasure correction using error correcting check words P0 is performed as well as error correction using error correcting check words P1.

Step 5: If the number of uncorrectable error positions detected in step 1 exceeds the number of parity bits, and the number of continuous error positions does not exceed the number of parity bits, erasure correction using the continuous error information based on error correcting check words P1 is performed, in addition to error correction using only error correcting check words P0.

Step 6: If the number of uncorrectable error positions detected in step 1 exceeds the number of parity bits, and the number of continuous error positions exceeds the number of parity bits, error correction using only error correcting check words P0 is performed.

Step 7: Error correction using error correcting check words P0 and erasure correction using the error position information generated in step 1 are executed. For uncorrectable error correcting check words P0, error position information is generated.

Step 8: Error correction is further repeated.

Step 9: Error correcting check words P1 of the information data are read out from the temporary memory 33 and sent to the error correcting unit 34.

Step 10: If the number of error positions in error correcting check words P1 is equal to or smaller than the number of parity bits, erasure correction using error correcting check words P0 is performed as well as error correction using error correcting check words P1.

Step 11: If the number of error positions in error correcting check words P1 exceeds the number of parity bits, error correction using only error correcting check words P1 is performed.

Step 12: Error correction using error correcting check words P1 and erasure correction using the error position information based on error correcting check words P0 and generated in step 7 are executed. If error correction using error correcting check words P1 cannot be performed, error position information is generated with respect to error correcting check words P1. The number of uncorrectable positions in error correcting check words P1 is detected on the basis of the generated error position information.

Step 14: Error correction is further repeated.

Step 15: The error correction processing is terminated.

The DVD reproducing apparatus of the second embodiment in FIG. 11 differs from the DVD reproducing apparatus of the first embodiment in FIG. 9 in that the initial error position detection in error correcting check words P1 is performed with respect to information data before it is stored in the temporary memory 33.

As described above, in the DVD reproducing apparatus of the second embodiment, since error correction is not executed in the initial detection of error positions in error correcting check word P1, even an error correcting check word having one error is detected as uncorrectable error correcting check word P1. This therefore raises the likelihood of the number of pieces of error position information in error correcting check words P1 exceeding the erasure correcting ability based on error correcting check words P0, as compared with the first embodiment. However, the erasure correcting ability based on error correcting check words P0 can be effectively used by extracting only burst error position information.

As has been described above, according to the present invention, by adding a unit for weighting error position information on the basis of the continuity of error position information to a conventional apparatus, erasure correction, which cannot be performed by the conventional apparatus, can be performed. Since error position information about burst errors, in particular, exhibit noticeable continuity, the present invention is effective for erasure correction using an error correcting check word sequence robust against burst errors.

When error correcting check words with a data sequence corresponding to the reception order of information data are added, as in the DVD reproducing apparatus, the error correcting ability can be improved by detecting errors in the information data before it is stored in the temporary memory. In this case, the number of error position information to be transferred to error correcting check words of the other type increases. However, with the selective use of error position information obtained in the present invention, the erasure correcting ability based on error correcting check words of the other type can be effectively used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data transmission system comprising:
    a unit for receiving information data to which an error correcting code constituted by internal and external symbols is added;
    a unit for temporarily storing the received information data;
    a unit for generating, by using one of the internal and external symbols, error position information regarding the other symbol of said internal and external symbols;
    a unit for correcting an error in the temporarily stored information data by using said other symbol on the basis of the error position information; and
    a unit for transmitting the error-corrected information data,
        wherein a sequence of data of said one of the internal and external symbols substantially corresponds to a reception order of the information data, and when the number of pieces of the error position information exceeds an erasure correcting ability of said other symbol, the error position information is weighted in accordance with continuity of the error position information, and erasure correction using said other symbol is performed by selecting error position information of the number of correctable errors.

2. An error correcting apparatus comprising:

means for temporarily storing information data received by a unit for receiving information data to which an error correcting code constituted by internal and external symbols is added;

means for generating, by using one of the internal and external symbols, error position information regarding the other symbol of said internal and external symbols by using the error correcting code; and a unit for correcting an error in the temporarily stored information data by using said other symbol on the basis of the error position information, wherein a sequence of data of said one of the internal and external symbols substantially corresponds to a reception order of the information data, and when the number of pieces of the error position information exceeds an erasure correcting ability of said other symbol, the error position information is weighted in accordance with continuity of the error position information, and erasure correction using said other symbol is performed by selecting error position information of the number of correctable errors.

3. An error correcting method comprising the steps of:

a. before storing, in a temporary memory, information data to which an error correcting check code constituted by internal and external symbols is added, detecting an error of one of the internal and external symbols which exhibits the same reception order as that of the information data, and transferring the detected error information to an error correcting apparatus;

b. reading out the other symbol of the internal and external symbols added to the information data from said temporary memory and sending the code to said error correcting apparatus;

c. performing error correction using only the other symbol and also performing erasure correction on the basis of the detected error information;

d. correcting the information data in said temporary memory;

e. reading out said one symbol of the information data from said temporary memory;

f. performing error correction using only said one symbol and also performing erasure correction using the error information of the other symbol;

g. correcting the information data in said temporary memory;

h. reading out the other symbol from said temporary memory;

i. performing error correction using only the other symbol and also performing erasure correction using the error information of said one symbol; and j. correcting the information data in said temporary memory, wherein error correction is performed in the order of the steps a to j, error correction after the step e is repeated as needed, a sequence of data of said one symbol substantially corresponds to the reception order of the information data, the error information is weighted in accordance with continuity of the error information, and erasure correction using the other symbol is performed by selecting correctable error information when the number of pieces of error information exceeds an erasure correcting ability based on the other symbol.

4. A method according to claim 3, wherein the detected error information is a result of syndrome calculation for said one symbol.

5. An error correcting method comprising the steps of:

a. storing information data in a temporary memory;

b. reading out one of internal and external symbols added to the information data from said temporary memory and sending the code to an error correcting apparatus;

c. performing error correction using only said one symbol and also performing erasure correction on the basis of the detected error information;

d. correcting the information data in said temporary memory;

e. reading out the other symbol of the internal and external symbols of the information data from said temporary memory;

f. performing error correction using only said the other symbol and also performing erasure correction using the error information of said one symbol;

g. correcting the information data in said temporary memory;

h. reading out said one symbol from said temporary memory;

i. performing error correction using only said one symbol and also performing erasure correction using the error information of the other symbol; and j. correcting the information data in said temporary memory, wherein error correction is performed in the order of the steps a to j, error correction after the step e is repeated as needed, a sequence of data of said one symbol substantially corresponds to the reception order of the information data, the error information is weighted in accordance with continuity of the error information, and erasure correction using the other symbol is performed by selecting correctable error information when the number of pieces of error information exceeds an erasure correcting ability based on the other symbol.

6. A DVD reproducing apparatus comprising:

a reception unit for receiving modulated information data to which an error correcting code constituted by internal and external symbols is added;

a demodulation unit for demodulating the information data;

a temporary memory for temporarily storing the demodulated information data;

detecting an error in one of the internal and external symbols of the demodulated information data;

an error correcting unit for correcting the error in the temporarily stored information data;

a descramble unit to which the error-corrected information data is input; and a transmission unit for transmitting the information data input from said descramble unit, wherein a sequence of data of the internal symbol corresponds to a reception order of the information data, error information of said one symbol is used for erasure correction for the other symbol of the internal and external symbols, the error information is weighted in accordance with continuity of the error information, and erasure correction using the other symbol is performed by selecting correctable error information when the number of pieces of error information exceeds an erasure correcting ability based on the other symbol.

7. A DVD reproducing apparatus comprising:
a reception unit for receiving modulated information data to which an error correcting code constituted by internal and external symbols is added;
a demodulation unit for demodulating the information data;
a temporary memory for temporarily storing the demodulated information data;
an error correcting unit for correcting the error in the temporarily stored information data;
a descramble unit to which the error-corrected information data is input; and
a transmission unit for transmitting the information data input from said descramble unit,
wherein a sequence of data of the internal symbol corresponds to a reception order of the information data, error information of said one symbol is used for erasure correction for the other symbol of the internal and external symbols, the error information is weighted in accordance with continuity of the error information, and erasure correction using the other symbol is performed by selecting correctable error information when the number of pieces of error information exceeds an erasure correcting ability based on the other symbol.

* * * * *